United States Patent [19]

Sakamoto et al.

[11] Patent Number: 4,700,155

[45] Date of Patent: Oct. 13, 1987

[54] FEEDTHROUGH NOISE ELIMINATING FILTER HAVING INTEGRALLY STEPPED MOUNTING PORTION

[75] Inventors: Yukio Sakamoto, Fukui; Tetsuo Tanaka; Toshio Hori, both of Takefu, all of Japan

[73] Assignee: Murata Manufacturing Co., Ltd., Kyoto, Japan

[21] Appl. No.: 798,714

[22] Filed: Nov. 15, 1985

Related U.S. Application Data

[63] Continuation of Ser. No. 530,123, Sep. 7, 1983, abandoned.

[30] Foreign Application Priority Data

Sep. 10, 1982 [JP] Japan ............................ 57-138218[U]

[51] Int. Cl.⁴ .............................................. H03H 7/01
[52] U.S. Cl. .................................... 333/182; 333/183; 361/302; 439/620
[58] Field of Search ................................ 333/182–185; 361/302; 339/143 R, 147 R

[56] References Cited

U.S. PATENT DOCUMENTS

| 3,275,953 | 9/1966 | Coda et al. ................. 339/147 X |
| 3,289,118 | 11/1966 | Garstang .................... 333/182 |
| 3,548,347 | 12/1970 | Miller et al. ................. 333/182 |
| 3,961,295 | 6/1976 | Hollyday et al. .......... 383/182 X |
| 4,021,759 | 5/1977 | Campi ....................... 333/182 |
| 4,267,529 | 5/1981 | Brun et al. ................. 333/185 X |
| 4,458,220 | 7/1984 | Carter et al. ............... 339/147 R X |

FOREIGN PATENT DOCUMENTS 1616793 9/1970 Fed. Rep. of Germany ...... 333/182

Primary Examiner—Eugene R. LaRoche
Assistant Examiner—Benny Lee
Attorney, Agent, or Firm—Wenderoth, Lind & Ponack

[57] ABSTRACT

A noise eliminating filter is incorporated in the circuits of electronic equipment to eliminate unwanted signals by grounding such signals. The filter includes a tubular metal casing, capacitors and a magnetic material housed within the casing, and a terminal passing through the capacitors and magnetic material. Capacitor housings are provided at both axial ends of the metal casing. A magnetic material housing which is smaller in diameter than each capacitor housing is formed between the capacitor housings and a feedthrough terminal is inserted through the capacitors contained in both the capacitor housings and the magnetic material contained in the magnetic material housing. The capacitors, which are to be incorporated in the housings at both end portions of the casing are made tubular and equal in diameter, thereby enabling the metal casing to be compact and enabling the capacitors to be standardized.

6 Claims, 3 Drawing Figures

FEEDTHROUGH NOISE ELIMINATING FILTER HAVING INTEGRALLY STEPPED MOUNTING PORTION

This application is a continuation of now abandoned application Ser. No. 530,123, filed Sept. 7, 1983, now abandoned.

BACKGROUND OF THE INVENTION

This invention relates to a noise eliminating filter for eliminating unwanted signals from electronic equipment by grounding such signals.

Generally, in order to prevent noise generation caused by unwanted signals in electronic equipment, a noise eliminating filter (electromagnetic interference filter) as shown in an equivalent circuit diagram in FIG. 1 is incorporated in the circuit to thereby ground unwanted signals.

The conventional noise eliminating filter used for the above purpose, as shown in FIG. 2, has been so constructed that a mounting male screw thread 12 is formed on the outer periphery of the lower half of a tubular metal casing 11 and a projection 13 is provided inside the lower end of casing 11 to thereby support a lower-stage capacitor 14 and a magnetic material 15 (e.g. ferrite beads); a larger diameter support 17 for supporting an upper-stage capacitor 16 is provided within the upper portion of metal casing 11, and a feedthrough terminal 18 passes through the upper and lower stage capacitors 16 and 14 and the magnetic material 15.

However, in the metal casing 11 constructed so as to contain the lower-stage capacitor 14 together with the magnetic material 15, the lower-stage capacitor 14 should be equal in the size to the magnetic material 15. The upper-stage capacitor 16 must also be supported by the metal casing 11, which results in the inconvenience of requiring the preparation of capacitors of two different sizes.

Also, a smaller inner diameter d of the metal casing 11 must be larger than an outside diameter of the lower-stage capacitor 14 so that the male screw thread 12 portion of the metal casing 11 must be fabricated with a smaller thickness which results in a lower mechanical strength thereof, thereby causing a problem in that the noise eliminating filter cannot actually be made small in size and lightweight.

SUMMARY OF THE INVENTION

An object of the invention is to provide a noise eliminating filter capable of being compact and lightweight without lowering the mechanical strength of its metal casing.

Another object of the invention is to provide a noise eliminating filter which can use capacitors of the same mechanical size in both the upper and lower positions.

The above and further objects and novel features of the invention will more fully appear from the following detailed description when the same is read in connection with the accompanying drawings.

DESCRIPTION OF THE PREFERRED EMBODIMENT

Figure 1:
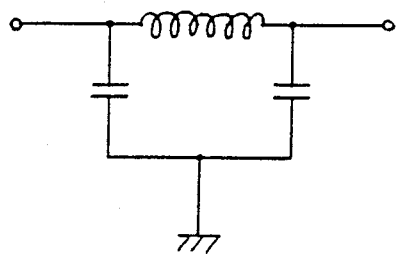
FIG. 1 is an equivalent circuit diagram of a noise eliminating filter.
Figure 2:
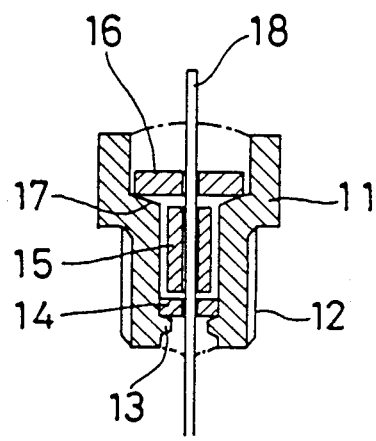
FIG. 2 is a sectional view of a conventional noise eliminating filter.
Figure 3:
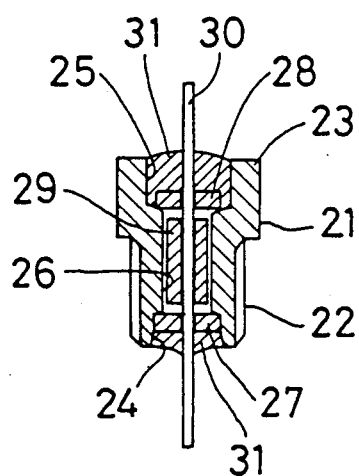
FIG. 3 is a sectional view of a noise eliminating filter of the invention.

Referring to FIG. 3, a tubular metal casing 21 is provided on the outer periphery of its lower half with a mounting male screw thread 22; the upper half of the casing 21 is provided with a head 23 which is fabricated so as to be larger in diameter than the male screw thread 22.

Inside the tubular casing 21 are formed capacitor housings 25 and 24 which each have one end opening on a respective end of casing 21. Casing 21 also has a magnetic material housing 26 which has a smaller diameter than the capacitor housings 25 and 24 and which is formed between the two housings.

The capacitor housings provided at the upper and lower ends of casing 21 are made about equal in diameter so that upper and lower capacitors 28 and 27 which are equal in diameter to each other, are housed within the housings 25 and 24.

The upper and lower capacitors 28 and 27 are incorporated in the capacitor housings 25 and 24 provided at the upper and lower portions of casing 21, and a magnetic material 29, such as ferrite bead, is housed within the intermediate magnetic material housing 26. A feedthrough terminal 30 is arranged so as to pass through the upper and lower capacitors 28 and 27 and the magnetic material 29, the capacitors 28 and 27 being made ring-shaped and the magnetic material 29 being made tubular.

Spaces at both end portions of casing 21 are filled with insulating resin 31. Unwanted signals flowing through the feedthrough terminal 30 are attenuated by the magnetic material 29 and the capacitors 28 and 27.

In addition, the upper and lower capacitors 28 and 27 each have one end electrically connected to the feedthrough terminal 30 and have the other end electrically connected to the casing 21 by, for example, soldering.

While a preferred embodiment of the invention has been described using specific terms, such description is for illustrative purpose only, and it is to be understood that changes and variations may be made without departing from the spirit or scope of the following claims.

What is claimed is:

1. A noise eliminating filter having an input terminal and an output terminal and a common ground terminal and having a monolithic tubular metal casing having an axis thereof and containing both a pair of toroidal capacitors and an inductor, each capacitor having first and second electrical connections and each capacitor having an aperture therein, said inductor having a pair of electrical connections and including an element formed of a magnetic material having a aperture therein, said pair of capacitors and said inductor being electrically connected together, said first electrical connections of said pair of capacitors being respectively connected to said input and output terminals of said filter and said second electrical connections of said pair of capacitors being connected to said common ground terminal of said filter and said pair of electrical connections of said inductor being respectively connected to said input and output terminals of said filter; wherein said casing has two capacitor housings and an inductor housing arranged between said capacitor housings, each of said capacitor housings respectively containing one of said pair of capacitors in a tubular aperture thereof and said inductor housing containing said inductor in a tubular aperture thereof, said casings and housings all being tubular and arranged axially along said axis of said housing; and wherein said capacitor housings both have a first inner tubular aperture width and said inductor housing has a second inner tubular aperture width which is less than that of said first aperture width, said filter further comprising a feed through terminal means arranged along said axis of said casing so as to extend beyond said casing, wherein said feed through terminal means passes through said apertures of said capacitors and said inductor and is electrically connected to said capacitors so as to form said input and output terminals of said filter and is electrically connected to said pair of electrical connections of said inductor but is electrically insulated from said casing which forms said common ground terminal; and wherein an outer width of each of said capacitors is greater than said second aperture width of said tubular aperture of said inductor housing and wherein said capacitors are respectively held in place by stepped portions of said casing formed between said capacitor housings and said inductor housing, said stepped portions being integrally formed with said casing.

2. A filter according to claim 1, wherein said capacitors are equal in width.

3. A filter according to claim 1, wherein spaces occur between each of said capacitor housings and their respective capacitors and wherein an insulating resin is filled within spaces formed between said capacitors and their respective housings.

4. A filter according to claim 1, wherein said inductor comprises a tubular shaped member.

5. A filter according to claim 1, wherein said inductor comprises a ferrite bead.

6. A filter according to claim 1, wherein a portion of an outer periphery of said tubular metal casing is threaded.

* * * * *